(12) United States Patent
Renner et al.

(10) Patent No.: US 10,670,640 B2
(45) Date of Patent: Jun. 2, 2020

(54) PREDICTION OF A VOLTAGE DIP IN A MOTOR VEHICLE

(71) Applicant: AUDI AG, Ingolstadt (DE)

(72) Inventors: Daniel Renner, Wurmannsquick (DE); Thomas Hackner, Greding (DE)

(73) Assignee: Audi AG, Ingolstadt (DE)

(*) Notice: Subject to any disclaimer, the term of this patent is extended or adjusted under 35 U.S.C. 154(b) by 78 days.

(21) Appl. No.: 15/762,718

(22) PCT Filed: Jul. 15, 2016

(86) PCT No.: PCT/EP2016/001233
§ 371 (c)(1),
(2) Date: Mar. 23, 2018

(87) PCT Pub. No.: WO2017/050404
PCT Pub. Date: Mar. 30, 2017

(65) Prior Publication Data
US 2018/0275174 A1    Sep. 27, 2018

(30) Foreign Application Priority Data

Sep. 25, 2015    (DE) .................. 10 2015 012 415

(51) Int. Cl.
*G01R 19/25*        (2006.01)
*G01R 31/379*       (2019.01)
(Continued)

(52) U.S. Cl.
CPC .......... *G01R 19/2513* (2013.01); *B60L 58/20* (2019.02); *G01R 19/16542* (2013.01);
(Continued)

(58) Field of Classification Search
CPC ............ G01R 19/2513; G01R 31/3662; G01R 19/16542; G01R 31/3668; G01R 31/007;
(Continued)

(56) References Cited

U.S. PATENT DOCUMENTS 6,275,001 B1 *    8/2001    Dierker ............... F02N 11/0866
                                                                320/103
2001/0035757 A1 *    11/2001    Maeckel ............... H02J 7/0036
                                                                324/426
(Continued)

FOREIGN PATENT DOCUMENTS

DE        10232539 A1    2/2004
DE    102009001300 A1    9/2010
(Continued)

OTHER PUBLICATIONS

English-language abstract of German Patent Application Publication No. DE 10232539 A1, published Feb. 5, 2004; 1 page.
(Continued)

*Primary Examiner* — Daniel Kessie
(74) *Attorney, Agent, or Firm* — Sterne, Kessler, Goldstein & Fox P.L.L.C.

(57) ABSTRACT

An embodiment relates to a method for predicting a voltage dip in a vehicle electrical system before a planned start of a load in a motor vehicle. The embodiment operates to ascertain a value of supply current expected to be required after the start of the load. An electrical voltage source and an energy store connected in parallel to a voltage source via the vehicle electrical system provide the supply current for operating the load. The energy store blocks a charge current into the energy store or blocks a discharge current out of the energy store based on a vehicle electrical system voltage of the vehicle electrical system being greater than a maximum value. Based on an instantaneous value of the vehicle electrical system voltage, the embodiment further ascertains a proportion of the supply current that the voltage source generates as a source current without the energy store until the vehicle electrical system voltage has fallen to the maximum value.

16 Claims, 5 Drawing Sheets

(51) Int. Cl.
  *H02J 1/14* (2006.01)
  *B60L 58/20* (2019.01)
  *G01R 19/165* (2006.01)
  *G01R 31/00* (2006.01)
  *H02J 7/34* (2006.01)
  *G01R 31/389* (2019.01)

(52) U.S. Cl.
  CPC ......... *G01R 31/007* (2013.01); *G01R 31/379* (2019.01); *H02J 1/14* (2013.01); *H02J 7/34* (2013.01); *B60Y 2300/192* (2013.01); *B60Y 2300/45* (2013.01); *G01R 31/389* (2019.01); *Y02T 10/7005* (2013.01); *Y02T 10/7066* (2013.01); *Y02T 10/92* (2013.01)

(58) Field of Classification Search
  CPC ... H02J 7/34; B60Y 2300/45; B60Y 2300/192
  See application file for complete search history.

(56) References Cited

U.S. PATENT DOCUMENTS

| | | | |
|---|---|---|---|
| 2003/0042872 A1* | 3/2003 | Larson | H02J 7/007192 320/152 |
| 2010/0224157 A1 | 9/2010 | Mizuno | |
| 2011/0001352 A1 | 1/2011 | Tamura et al. | |
| 2011/0027626 A1* | 2/2011 | Lattin | H02J 7/1423 429/50 |
| 2013/0158776 A1* | 6/2013 | Rini | G06F 17/00 701/29.4 |
| 2015/0191100 A1 | 7/2015 | Schindler | |
| 2017/0106758 A1* | 4/2017 | Sakatani | B60R 16/033 |

FOREIGN PATENT DOCUMENTS

| | | |
|---|---|---|
| DE | 102011014811 A1 | 10/2011 |
| DE | 102011054582 A1 | 4/2012 |
| DE | 102012217184 A1 | 6/2014 |
| EP | 2469070 A1 | 6/2012 |

OTHER PUBLICATIONS

English-language abstract of German Patent Application Publication No. DE 102009001300 A1, published Sep. 9, 2010; 2 pages.
English-language abstract of German Patent Application Publication No. DE 102011014811 A1, published Oct. 6, 2011; 1 page.
English-language abstract of German Patent Application Publication No. DE 102011054582 A1, published Apr. 19, 2012; 1 page.
English-language abstract of European Patent Application Publication No. EP 2469070 A1, published Jun. 27, 2012; 1 page.
International Search Report and Written Opinion of the International Searching Authority directed to related International Patent Application No. PCT/EP2016/001233, dated Oct. 17, 2016, with attached English-language translation; 20 pages.
International Preliminary Report on Patentability directed to related International Patent Application No. PCT/EP2016/001233, dated Apr. 5, 2018; 9 pages.

* cited by examiner

PREDICTION OF A VOLTAGE DIP IN A MOTOR VEHICLE

TECHNICAL FIELD

An embodiment relates to a method for predicting a voltage dip or a voltage reduction in a vehicle electrical system upon a planned start of a load in a motor vehicle. The method is provided for the case in which the load is supplied with electrical energy via a vehicle electrical system, wherein electrical energy is provided, on the one hand, by at least one voltage source and, on the other hand, by an energy store connected in parallel to the at least one voltage source. An embodiment also includes a motor vehicle which is operated according to the method.

BACKGROUND

Because of the increasing electrification of the devices for providing vehicle functions, a performance increase of the central electrical supply unit in motor vehicles is necessary. The electrical supply unit has heretofore only been provided by a so-called starter battery, e.g., a lead accumulator, when the motor vehicle is out of service, e.g., the internal combustion engine is shut down. Another name for a lead accumulator is lead-acid battery. In addition, a generator is available to provide a source voltage when the internal combustion engine is running or started.

To achieve a performance increase of the supply unit, a promising approach is to provide a multiple battery supply in the vehicle electrical system of the motor vehicle. For this purpose, a high-performance store which has small dimensions in relation or in comparison, and which is generally based on the lithium-ion battery, and an electrical store having larger dimensions in relation thereto in the form of the known lead accumulator can be provided. The direct connection of the two batteries is produced via the vehicle electrical system as a parallel circuit.

Said increased performance capacity is achieved in this way, but a different system behavior of the electrical supply unit also results. If an electrical load is put into operation and therefore consumes an electrical current from the vehicle electrical system, it is thus dependent on the interaction of the batteries connected in parallel with the vehicle electrical system which voltage results in reaction to the supply current required by the load. However, if possible one would wish to predict this or know it beforehand, so that if necessary the start of the load can be blocked, if the voltage dip induced by the supply current would interfere with the operation of other electrical loads. In other words, an estimation of the voltage dip upon loading of the vehicle electrical system, in particular by a high power load, for example, an electrical starter or a compressor motor, is of interest.

A method for avoiding voltage dips when switching on electrical loads in a motor vehicle is known from DE 102 32 539 A1. After a switching-on request, the peak power available in the vehicle electrical system is ascertained and the switching-on time for the load is chronologically delayed such that the peak power required by the load is also guaranteed to exist at the switching-on time.

A motor vehicle having a generator and two electrical batteries is known from DE 10 2011 054 582 A1, wherein power paths for conducting electrical currents are established by a switching unit of the motor vehicle.

SUMMARY

The embodiment is based on the object of predicting a voltage dip in a vehicle electrical system of a motor vehicle having a parallel circuit made of at least one voltage source and an energy store, as can result upon a start of an electrical load.

The object is achieved by the subjects of the independent patent claims. Advantageous refinements of the embodiment are provided by the features of the dependent patent claims.

A method is provided by the embodiment for predicting the voltage dip in a vehicle electrical system upon a planned start of a load in the motor vehicle. The method presumes that at least one electrical voltage source and an energy store connected in parallel to the at least one voltage source via the vehicle electrical system are provided in the motor vehicle for operating the load. A parallel circuit is to be understood in this case to mean that the at least one voltage source and the energy store are electrically connected permanently or continuously by electrical conducting elements of the vehicle electrical system. Thus, no switch is provided for electrically decoupling or isolating the energy store from the vehicle electrical system and/or the at least one voltage source. The energy store has the property in this case that it does not absorb any (noticeable) charge current and does not generate any discharge current, if the vehicle electrical system voltage is greater than a predetermined maximum value. Such an energy store is provided, for example, by the described lead accumulator, to which, for example, a charge voltage of 15 V can be applied, but this does not have the result that the idle voltage in the galvanic cells of the lead accumulator also adjusts itself to this charge voltage. Instead, the terminal voltage of the lead accumulator rises to 15 V only upon applied charge voltage. If one removes the voltage source, the terminal voltage drops backs to a maximum voltage, without a relevant discharge current having to flow for this purpose. The reason for this is the so-called overvoltage of lead accumulators. The value of the maximum voltage, e.g., the maximum value, is dependent on the prior history and the battery technology of the lead accumulator. The maximum value can be ascertained, for example, by means of a characteristic curve. For example, the maximum value can be in a range of 12.8 V to 13.5 V.

In the method, a supply current expected to be required after the start by the load is ascertained. Proceeding from an instantaneous value of the vehicle electrical system voltage, it is ascertained which proportion of this supply current the at least one voltage source generates as the source current without the energy store, until the vehicle electrical system voltage has fallen to said maximum value. As long as the vehicle electrical system voltage is greater than the maximum value, the supply current for the load is exclusively provided by the at least one voltage source. In this case, the vehicle electrical system voltage sinks in a way known per se because of the internal resistance of the at least one voltage source. In other words, the voltage dip occurs in the vehicle electrical system. It is ascertained by the method which proportion of the supply current the at least one voltage source supplies until the maximum value is reached, e.g., the vehicle electrical system voltage has fallen to the maximum value.

The advantage results due to the embodiment that the individual current allocation between the at least one voltage source, on the one hand, and the energy store, on the other hand, is taken into consideration. For this purpose, it is ascertained how much of the required supply current is provided or generated solely by the at least one voltage source, before the vehicle electrical system voltage has dipped or fallen sufficiently far overall that the energy store also reacts with the discharge current, because the vehicle electrical system voltage is less than the maximum value.

The method according to the embodiment is carried out in particular with the internal combustion engine of the motor vehicle shut down. The internal combustion engine can be, for example, a diesel engine or a gasoline engine.

The embodiment also includes optional refinements, the features of which result in additional advantages.

One refinement provides that the source current of the at least one voltage source is ascertained on the basis of a respective internal resistance of the at least one voltage source. The voltage dip from the instantaneous value of the vehicle electrical system voltage down to below the maximum value is exclusively ascertained on the basis of the respective internal resistance of the at least one voltage source, without considering the internal resistance of the energy store. In other words, the voltage dip is ascertained independently of the internal resistance of the energy store. The advantage results in this way that an influence of the energy store is not incorrectly assumed already in the voltage range above the maximum value, as would otherwise be the case upon a lump-sum computation from a parallel circuit of the at least one voltage source and the energy store.

The source current means solely the proportion of the supply current which flows, so that vehicle electrical system voltage sinks from the instantaneous value to the maximum value because of the internal resistance of the at least one voltage source. It can be that this is not sufficient to provide the entire supply current. One refinement additionally provides that a residual current $Id$ between the ascertained supply current $I0$ and the source current $I1$ is ascertained and proceeding from said maximum value $Umax$, it is ascertained which final value $Uend$ of the vehicle electrical system voltage results upon a parallel current emission of the at least one voltage source and the energy store. If the source current $I1$ alone is not sufficient, the residual current $Id=I0-I1$ thus results. This additional discharge current is then provided both by the at least one voltage source and also by the energy store jointly, since the maximum voltage value $Umax$ is reached and fallen below. The advantage results due to the refinement that the change of the system behavior of the electrical supply unit formed from the at least one voltage source and the energy store is actually considered accurately if a phase transition or a phase change from the supply exclusively by the at least one voltage source, on the one hand (vehicle electrical system voltage greater than the maximum value) toward the joint supply by the at least one voltage source and the energy store, on the other hand (vehicle electrical system voltage less than the maximum value) results.

One refinement thereof provides that the final value $Uend$ is ascertained on the basis of a parallel circuit of the respective internal resistances $Ri1$ of the at least one voltage source and the internal resistance $Ri2$ of the energy store. This thus results in a parallel circuit or a parallel circuit resistance $Rp$ made of the internal resistance $Ri1$ and the internal resistance $Ri2$, which is also written as $Rp=Ri1\|Ri2$. Overall, the final value $Uend$ for the vehicle electrical system voltage therefore results as $Uend=Umax-Id\,Rp$.

One refinement thereto provides that it can also occur that the instantaneous value of the vehicle electrical system voltage is already less than the maximum value. There is then only the second voltage phase, in which the parallel or joint supply of the load is performed by both the at least one voltage source and also the energy store. In this refinement, exclusively the parallel current emission is thus considered, if the instantaneous value of the vehicle electrical system voltage is less than the maximum value. The method is therefore flexibly applicable to all voltage cases.

One refinement relates to the case that a critical voltage dip is recognized, by which the functionality of other electrical loads is endangered or impaired. In this refinement, a vehicle function of the motor vehicle plans the start of the load. For example, the vehicle function can be a start-stop function for an engine start of an internal combustion engine. The start-stop function shuts off the internal combustion engine when the motor vehicle is standing at a traffic signal, for example. This is known per se from the prior art. The vehicle function is deactivated in the refinement if the final value of the vehicle electrical system voltage, as is predicted based on the supply current of the electrical starter of the internal combustion engine, is less than a predetermined minimum voltage value $Umin$. In other words, for example, the start-stop function is thus deactivated, so that the internal combustion engine is always operated continuously or runs at a traffic signal. The advantage results in this way that the other electrical loads are not impaired or disturbed in the functionality thereof by the start of the load.

One refinement provides that the energy store is a lead accumulator and the maximum value is based on a maximum idle voltage plus an overvoltage of the lead accumulator. Lead accumulators have the described electrical behavior, that a voltage greater than the maximum value can be applied at the connection terminals thereof, but this does not induce a noticeable reaction in the lead accumulator, however, such that a charge current would flow into the lead accumulator. A significant discharge current or compensation current will also not be induced in the event of a reduction of the terminal voltage, which is above the maximum value. The lead accumulator first reacts with a current flow when voltage changes below the maximum value occur.

As already stated, the embodiment includes a motor vehicle. The motor vehicle according to the embodiment has, in the described manner, at least one electrical voltage source and an energy store connected in parallel to the at least one voltage source via a vehicle electrical system of the motor vehicle for operating an electrical load. The energy store blocks a charge current into and a discharge current out of the energy store in the described manner in the event of a vehicle electrical system voltage greater than a predetermined maximum value. This is an electrochemical phenomenon or behavior of the energy store in this case, as is known in the described manner of a lead accumulator. In the motor vehicle according to the embodiment, a control unit is provided, which is configured to carry out an embodiment of the method according to the embodiment to predict a voltage dip before a planned start of the electrical load. The control unit can be implemented, for example, on the basis of a microcontroller or a microprocessor. The control unit can be in particular a control device of the motor vehicle.

As already stated, the energy store is in particular a lead accumulator.

A further embodiment provides that the at least one voltage source comprises a lithium-ion battery and/or a generator and/or a DC voltage converter (DC-DC converter). These voltage sources have a significantly different reaction behavior to a start of a load in comparison to a lead accumulator, so that, by way of the method according to the embodiment and in the motor vehicle according to the embodiment, the prediction of the voltage dip is particularly reasonable and advantageous here. For the case in which the voltage source is a lithium-ion battery, it is preferably provided that a storage capacity of the voltage source is less than a storage capacity of the energy store.

The motor vehicle according to the embodiment is described as an automobile, in particular as a passenger automobile.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

DETAILED DESCRIPTION

In an embodiment explained hereafter, the described components of the embodiment each represent individual features to be considered independently of one another, which can each also refine the embodiment independently of one another and therefore are also to be considered part of the embodiment individually or in a combination other than that shown. Furthermore, the described embodiment can also be supplemented by further ones of the above-described features of the embodiment.

Functionally-equivalent elements are each provided with the same reference signs in the figures.

Figure 1:
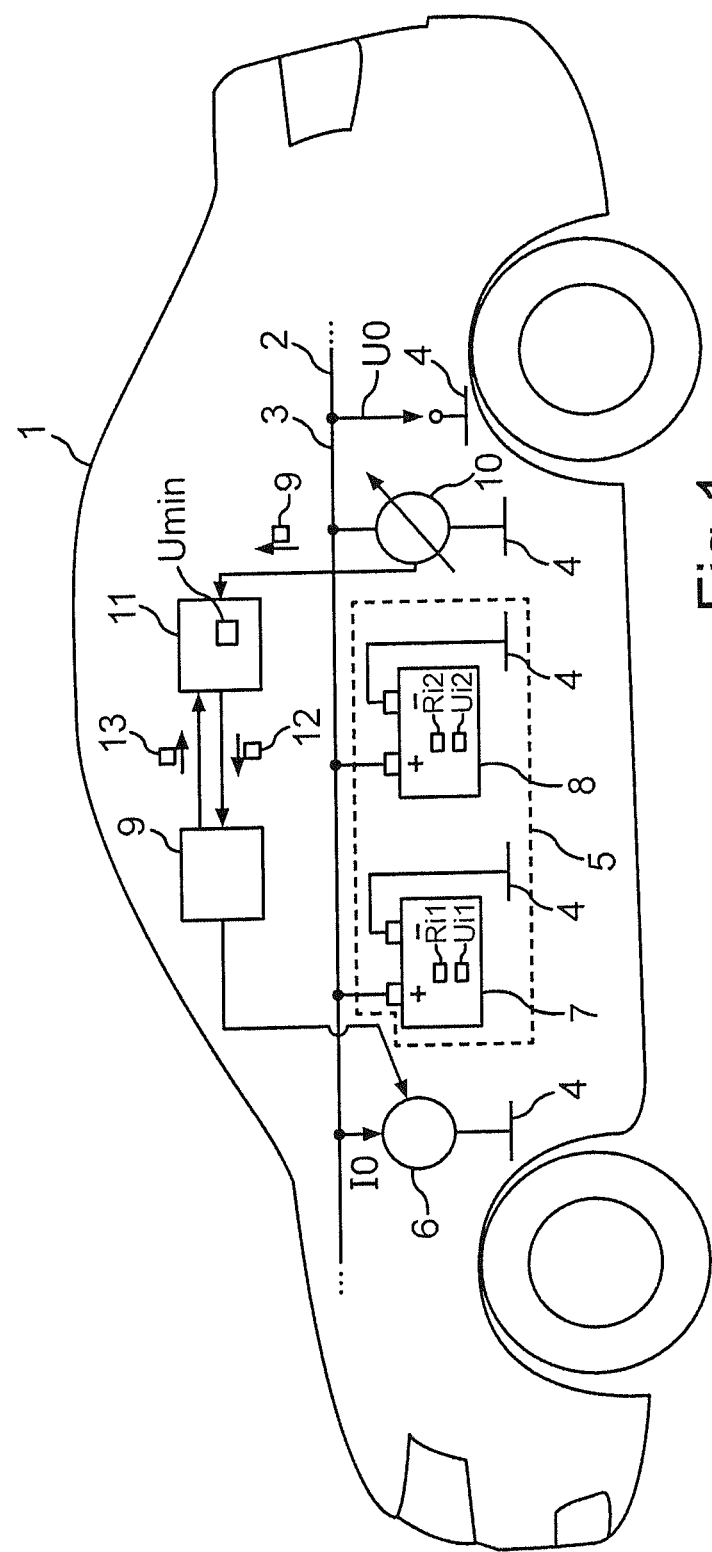
FIG. 1 shows a motor vehicle according to some embodiments.

FIG. 1 shows a motor vehicle 1, which can be, for example, an automobile, in particular a passenger automobile. The motor vehicle 1 has a vehicle electrical system 2, in which a vehicle electrical system voltage U is provided, which can be provided, for example, between a positive line 3 of the vehicle electrical system 2 and a ground potential 4 of the motor vehicle 1.

The positive line 3 can be formed, for example, by a cable and/or a busbar. The ground potential 4 can be formed, for example, by a frame and/or a carrier element of the motor vehicle 1. An electrical supply unit 5 and electrical loads are electrically connected to one another via the electrical system 2. Only one electrical load 6 of the electrical loads is shown in FIG. 1. The supply unit 5 has a voltage source 7 and an energy store 8 in the example shown. The voltage source 7 can be, for example, a lithium-ion battery. The energy store 8 can be, for example, a lead accumulator, e.g., a lead-acid battery. The voltage source 7 and the energy store 8 are continuously electrically connected to one another via the vehicle electrical system 2, e.g., continuously or permanently connected in parallel. The vehicle electrical system voltage U0 is generated by the voltage source 7 and the energy store 8. The load 6 can be controlled by a monitoring unit 9 such that the load 6 is started and shut down by the monitoring unit 9. The load 6 can be, for example, an electrical starter for an internal combustion engine (not shown) of the motor vehicle 1. The monitoring unit 9 can be implemented, for example, by an engine control unit. A start-stop operation of the motor vehicle 1 by means of the load 6 as a starter can be implemented, for example, by the monitoring unit 9.

Upon switching on or activation of the load 6 by the monitoring unit 9, the load 6 consumes or requires a supply current I0. A voltage value of the vehicle electrical system voltage U0 results depending on a current strength of the supply current I0. The reason is that a part of the electrical voltage generated by the voltage source 7 and the energy store 8 drops in a respective internal resistance Ri1, Ri2.

Figure 2:
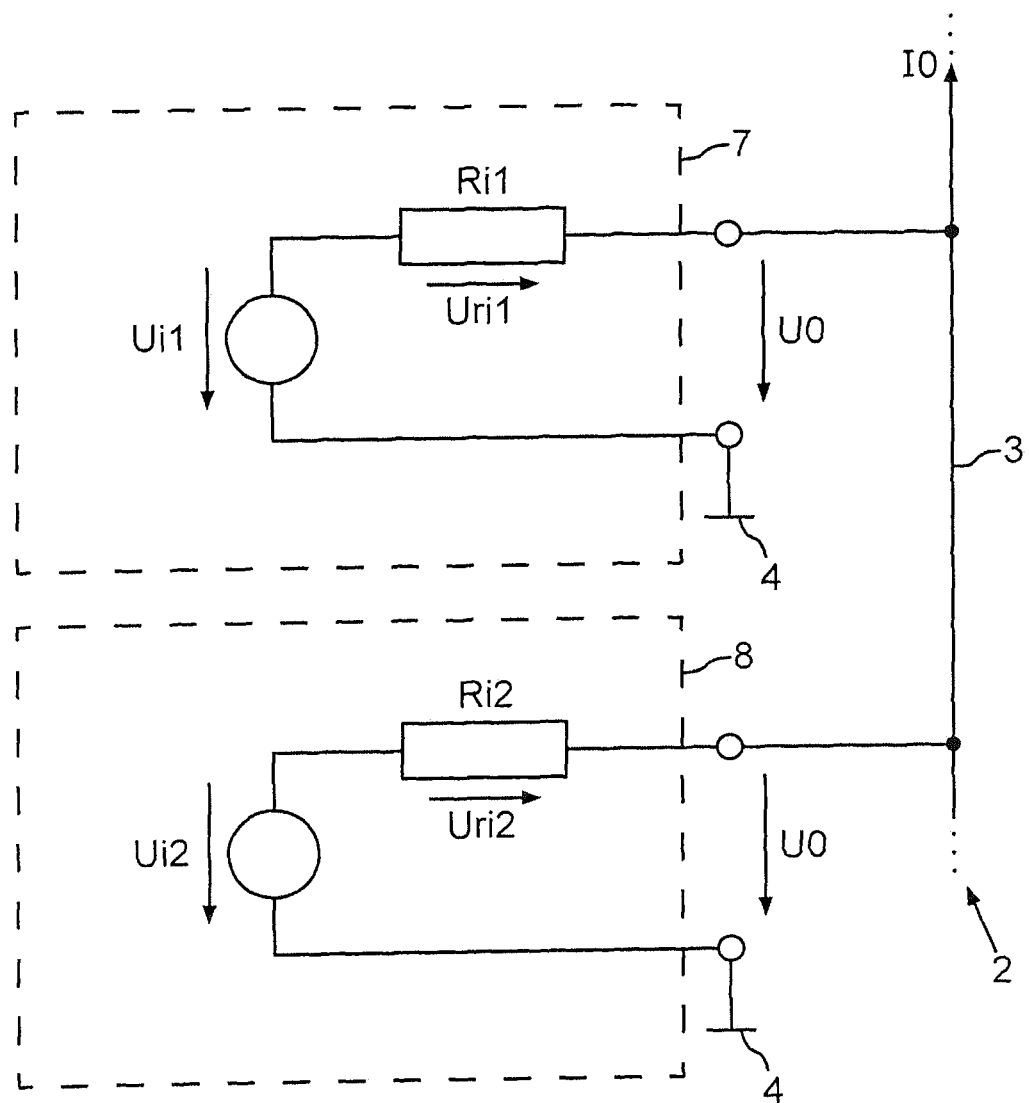
FIG. 2 shows a circuit diagram of a voltage source and an energy store, according to some embodiments.

For this purpose, it is illustrated in FIG. 2 how an internal voltage Ui1, Ui2, as is generated by the voltage source 7 or the energy store 8, drops during a current flow partially by the internal resistance voltage Uri1, Uri2 inside the voltage source 7 and energy store 8, so that the vehicle electrical system voltage U0 corresponds to the difference of the internal voltage Ui1, Ui2 and the internal resistance voltage Uri1, Uri2.

If the supply current I0 thus does not flow, the vehicle electrical system voltage U0 has a greater voltage value than in the case in which the supply current I0 flows with an absolute value greater than 0.

An instantaneous value Ustart of the vehicle electrical system voltage U0 can be detected by a voltage measuring unit 10 in a manner known per se in the motor vehicle 1. A control unit 11 can ascertain depending on the instantaneous value Ustart of the vehicle electrical system voltage U0 whether the sinking of the vehicle electrical system voltage U0 because of the supply current I0 can be sufficiently large that further loads will be impaired in the functionality thereof. If this is the case, a blocking signal 12 is thus generated by the control unit 11, which has the effect in the monitoring unit 9 that the load 6 is not started. The monitoring unit 9 therefore represents a vehicle function which is this activated if it is recognized by the control unit 11 that the voltage dip would sink to a final value Uend of the vehicle electrical system voltage U0, which is less than a threshold value or minimum voltage value Umin.

The control unit 11 can predict the voltage dip, e.g., the load 6 does not first have to be activated, but rather the voltage dip is predicted or forecast. For this purpose, the control unit 11 additionally ascertains a current value 13 of the presumably flowing supply current I0, as can result upon the start or after the start of the load 6. For example, the current value 13 can be communicated to the control unit 11 by the monitoring unit 9. The control unit 11 can be implemented, for example, on the basis of a microcontroller or microprocessor.

Figure 3:
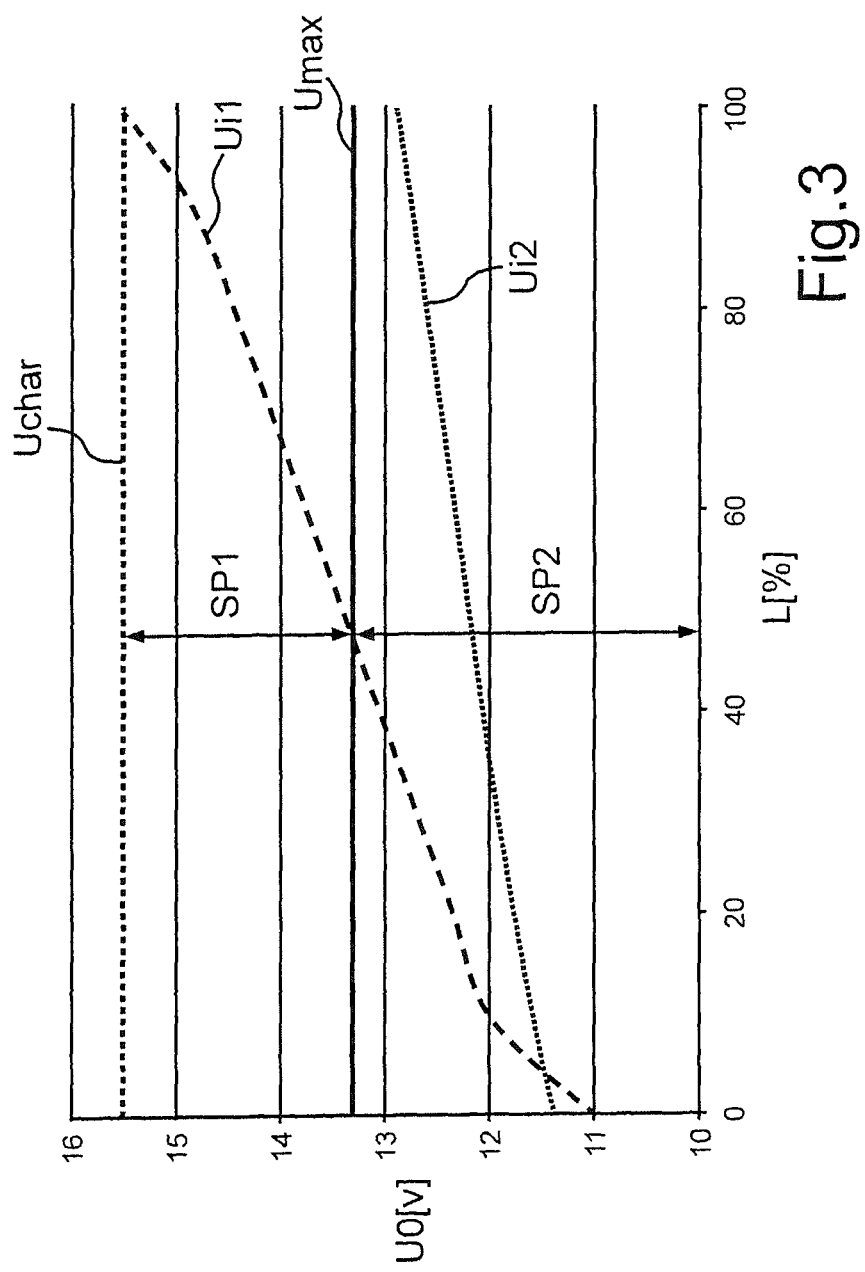
FIG. 3 shows characteristic curves for voltages, according to some embodiments.

It is illustrated hereafter on the basis of FIG. 3 which problem results upon the prognosis or prediction of the final value Uend of the vehicle electrical system voltage U0 if two technologically different electrical power sources, namely the voltage source 7 and the energy store 8, are provided in the electrical supply unit 5 to provide the supply current I0.

FIG. 3 shows, depending on the charge state L of the energy store 8 and a lithium-ion battery as the voltage source 7, the resulting vehicle electrical system voltage U0. During operation of the internal combustion engine, a generator (not shown) generates a charge voltage Uchar, which can be 15.5 V, for example. The voltage source 7 as the lithium-ion battery and the energy store 8 are charged as a result of the charge voltage Uchar. A lead accumulator overall itself generates as a result of the overvoltage effect, e.g., without the charge voltage Uchar, in particular at most a terminal voltage or vehicle electrical system voltage which is a maximum value Umax, for example, 13.5 V, which is less than the charge voltage Uchar. If a greater voltage, such as the charge voltage Uchar, is applied at the terminals of the energy store 8, it thus no longer reacts with a charge current. In the same way, the energy store 8 also does not independently generate a discharge current for the case in which the vehicle electrical system voltage U0 is in a range between the charge voltage Uchar and the maximum value Umax of the vehicle electrical system voltage. This range is identified in FIG. 3 as the voltage phase SP1. If the vehicle electrical system voltage U0 has a voltage value which is less than or equal to the maximum value Umax, a discharge current also results at the energy store 8. This voltage situation, in which the energy store 8 also reacts with a discharge current, is identified as the voltage phase SP2 in FIG. 3.

Figure 4:
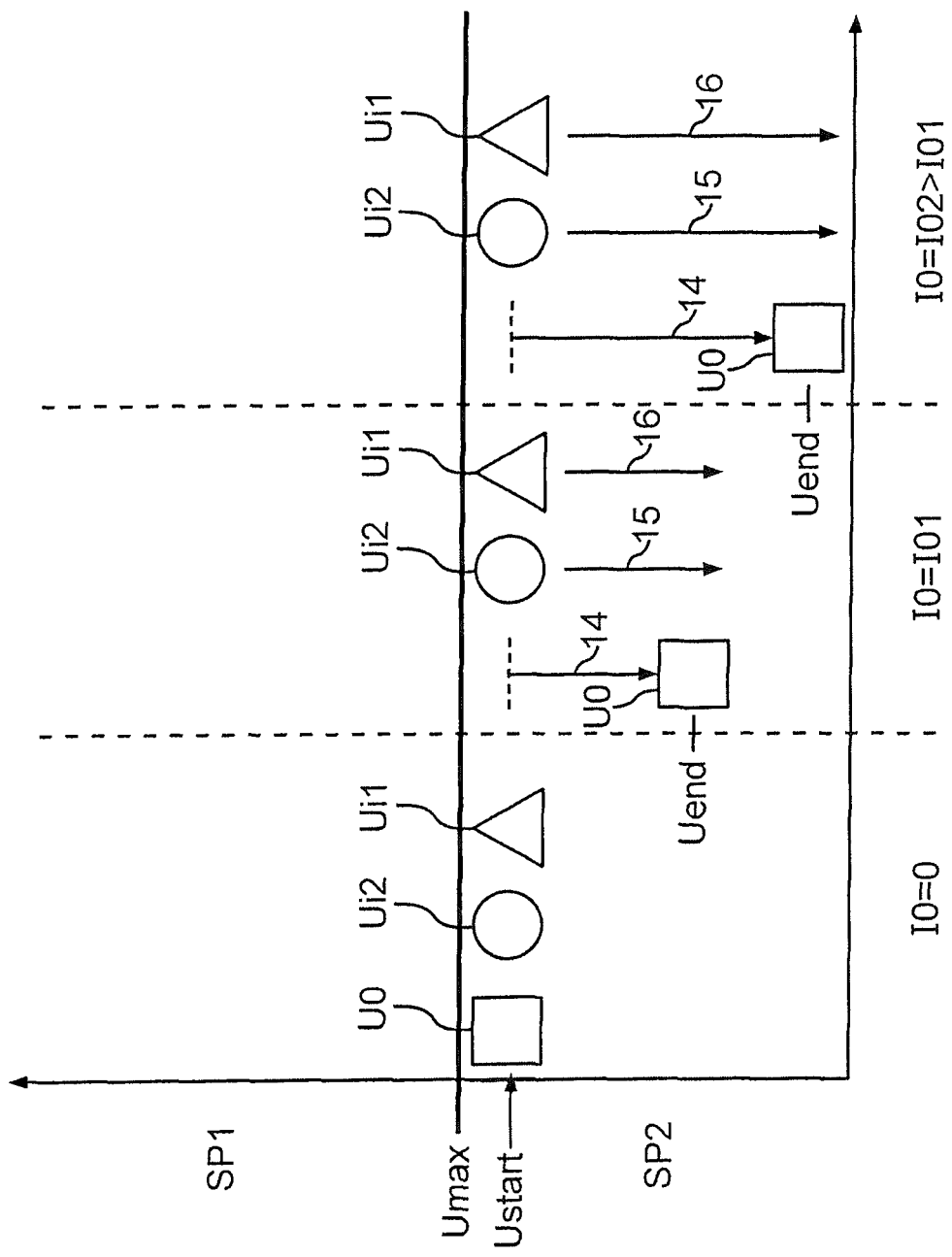
FIG. 4 shows a diagram in which an instantaneous value of a vehicle electrical system voltage is less than a maximum value, according to some embodiments.
Figure 5:
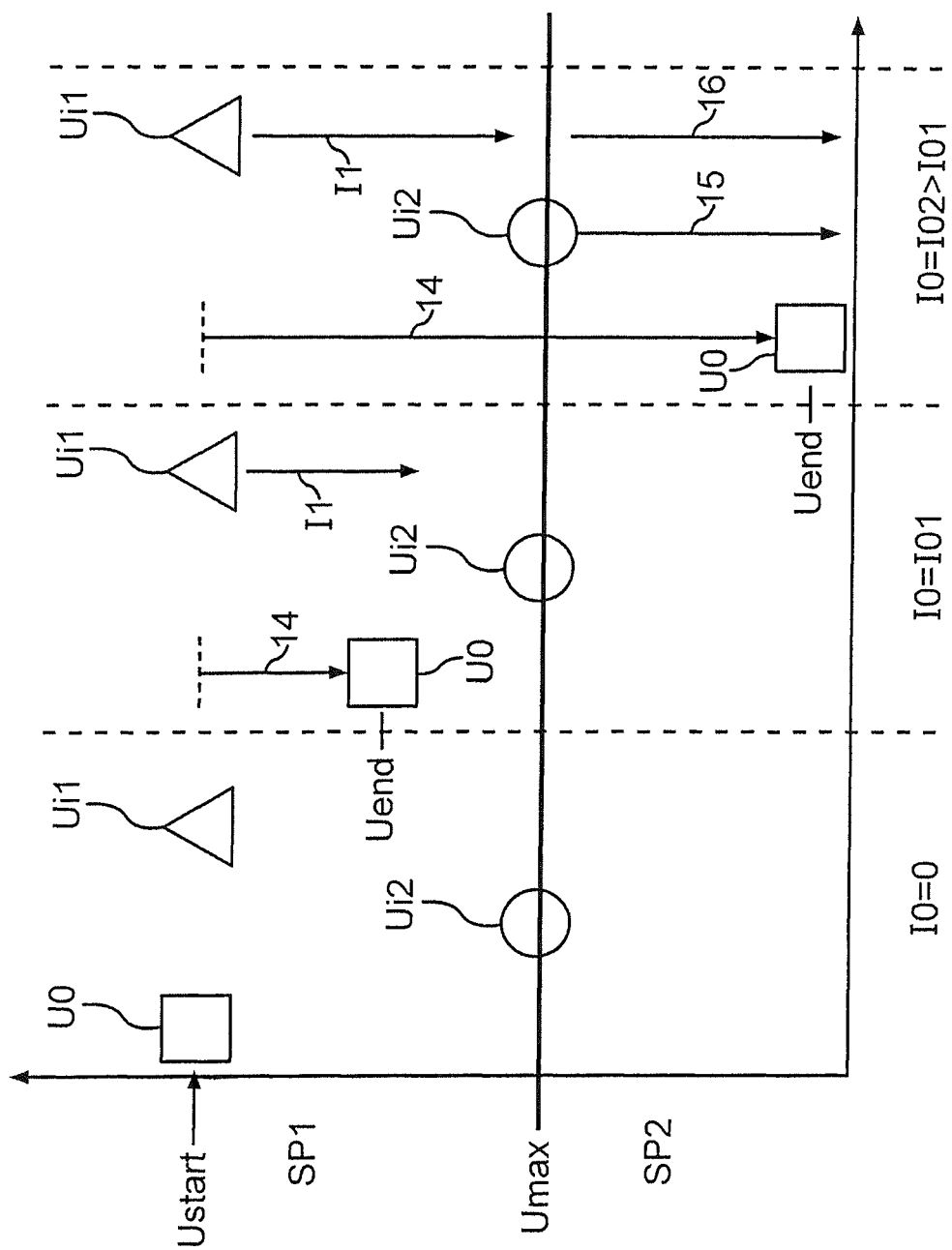
FIG. 5 shows a diagram in which the instantaneous value of the vehicle electrical system voltage is greater than the maximum value, according to some embodiments.

FIG. 4 and FIG. 5 illustrate how the voltage dip 14 to the final value Uend can be prognosticated or forecast by the control unit 11 proceeding from the instantaneous value Ustart of the vehicle electrical system voltage U0 already before the start of the load 6 on the basis of the current value 13.

FIG. 4 illustrates in this case that the voltage phase SP2 is already provided by the instantaneous value Ustart, e.g., the value Ustart is less than or equal to the maximum value Umax. FIG. 4 illustrates two cases for the supply current I0. In a first case, the current value 13 for the supply current I0 has the value I01. For a second case, the current value 13 for the supply current I0 is the current value I02, which is greater than the current value I01. Since the voltage phase 2 is provided, the control unit 13 presumes that the supply current I0 is provided both by the voltage source 7 and also the energy store 8. A partial current 15, 16 thus results in each case. The supply current I0 is allocated to the partial currents 15, 16 in this case with inverse proportionality to the internal resistances Ri1, Ri2 of the voltage source 7 and the energy store 8. If the instantaneous voltage value 9 thus directly or indirectly signals the voltage phase 2, the following final value thus results:

$$SP2: Uend = Ustart - I0 Rp,$$

wherein $Rp = Ri1 \| Ri2$ (resistances connected in parallel).

FIG. 5 illustrates the case that the voltage phase SP1 is signaled by the instantaneous value Ustart of the vehicle electrical system voltage U0 as the starting situation. In other words, the instantaneous value Ustart of the vehicle electrical system voltage U0 is greater than the maximum value Umax. FIG. 5 illustrates in this case that before the start of the load 6 (I0=0), the voltage source 7 can provide an active contribution to supporting the vehicle electrical system voltage U0, while the energy store 8 is inactive, e.g., does not generate a discharge current, as long as the vehicle electrical system voltage U0 is greater than the maximum value Umax. The energy store 8 is thus fixed at the maximum value Umax.

If a supply current I0 having a current value I01 is now provided, which is comparatively small, the vehicle electrical system voltage U0 is thus exclusively supported by the voltage source 7 and the following final value results:

$$SP1: Uend = Ustart - I01 Ri1$$

The final value Uend is therefore still above the maximum value Umax.

In the case of a large supply current I0 having a current value I02 greater than the current value I01, a change from the voltage phase SP1 to the voltage phase SP2 can occur, as illustrated in FIG. 5 on the right. To also be able to correctly prognosticate the final value Uend here, the control unit 11 firstly ascertains a source current I1, which is exclusively generated by the current source 7 and is sufficiently large that the maximum value Umax would result at the terminals of the voltage source 7. This source current I1 is computed as follows:

$$SP1+SP2: I1 = (Ustart - Umax)/Ri1$$

If the source current I1 is less than the planned supply current I02, a differential current or residual current is thus computed:

$$SP1+SP2: Id = I0 - I1$$

Proceeding from the maximum value Umax, the voltage phase 2 is then again assumed, wherein one now proceeds from the maximum value Umax:

$$SP1+SP2: Uend = Umax - Id\, Rp$$

It is to be noted in this case that the voltage of the energy store 8 is composed of the internal voltage Ui2 and in overvoltage (not shown), as is known per se in conjunction with lead accumulators from the prior art.

A method for the predictive ascertainment of the voltage dip 14 upon current load of the vehicle electrical system 2 by a load 6 with a load current I0 is thus provided by the control unit 11. It can be taken into consideration for this purpose that the supply current is provided by multiple electrical stores, namely the voltage source 7 and the energy store 8. Nonetheless, a correct prediction of the final value Uend of the vehicle electrical system voltage U0 is possible. Depending on the value Ustart of the vehicle electrical system voltage U0 applied upon the beginning of the current load in the vehicle electrical system 2, the voltage dip differs significantly, because two different voltage phases SP1, SP2 can result. Depending on the instantaneous voltage situation according to the voltage value Ustart upon beginning of the current load, the control unit 11 differs accordingly between the voltage phases SP1, SP2 for the predictive estimation of the voltage dip 14. The individual current allocation to the voltage source 7 and the energy store 8 is considered depending on the properties of the electrical supply unit 5 used, e.g., the voltage source 7 and the energy store 8. It is thus ensured that at an arbitrary value Ustart for the vehicle electrical system voltage U0, the voltage dip 14 can be correctly ascertained predictively for all possible current values I01, I02 of the supply current I0 and for each charge state L.

The described case differentiation between the voltage phase SP1 and the voltage phase SP2 enables the voltage dip 14 to be determined exactly and independently of the starting voltage, as described by the voltage value 9, and/or the current strength load of the supply current I0. A prediction of the voltage dip 14 in the motor vehicle 1 is thus ensured.

The voltage level of the operating point according to the instantaneous voltage value Ustart upon beginning of the current load according to the supply current I0 is located below or exactly at the level of the voltage value of the idle voltage including the overvoltage of the energy store 8, e.g., at the level of or below the maximum value Umax. The complete idle voltage curve of the energy store 8 is covered by the voltage source 7. Therefore, in this case the voltage dip 14 can be computed by a parallel circuit of the store internal resistances Ri1, Ri2.

The determination of the voltage dip 14 can be performed in this case both for the voltage at the terminals of the voltage source 7 and also of the energy store 8, depending on which interconnection topology is presumed.

In the case that the voltage level of the instantaneous operating point according to the voltage value Ustart upon beginning of the current load according to the supply current I0 is above the maximum value Umax, the voltage phase SP1 results as the initial phase or starting phase. The voltage dip 14 from the operating point to the maximum value Umax has to be computed separately here. The voltage source 7 assumes the complete current value I1 up to the voltage level of the maximum value Umax here. It then changes into the voltage phase SP2. The voltage dip 14 is ascertained here from the voltage value or maximum value Umax up to the final voltage value Uend by the allocation of the remaining residual current Id onto the two corresponding to the resistances Ri1, Ri2 thereof. The partial currents 15, 16 result.

Overall, the example shows how a method for ascertaining the voltage dip in a multiple battery vehicle electrical system in conventional motor vehicles can be provided by the embodiment.

The invention claimed is:

1. A method for predicting a voltage dip in a vehicle electrical system before a planned start of a load in a motor vehicle, comprising:
ascertaining a value of supply current expected to be required after the start of the load,
wherein at least one electrical voltage source and an energy store in the motor vehicle are connected in a parallel circuit to the vehicle electrical system, the at least one electrical voltage source and the energy store provide the supply current for operating the load, and wherein the energy store neither receives a charging current nor discharges generated power if a vehicle electrical system voltage of the vehicle electrical system is greater than a predetermined maximum value; and
based on an instantaneous value of the vehicle electrical system voltage, ascertaining a proportion of the supply current that the at least one electrical voltage source generates as a source current without the energy store until the vehicle electrical system voltage has fallen to the predetermined maximum value.

2. The method of claim 1, further comprising:
ascertaining the source current based on a respective internal resistance of the at least one electrical voltage source.

3. The method of claim 2, further comprising:
ascertaining a residual current between the ascertained supply current and the ascertained source current; and
ascertaining, based on the predetermined maximum value, a final value of the vehicle electrical system voltage that results upon a current emission from the parallel circuit of the at least one electrical voltage source and the energy store.

4. The method of claim 3, further comprising:
ascertaining the final value based on the respective internal resistance of the at least one electrical voltage source and an internal resistance of the energy store.

5. The method of claim 4, wherein the ascertaining the final value further comprises:
based on the instantaneous value of the vehicle electrical system voltage being less than thy: predetermined maximum value, ascertaining the final value based exclusively on the current emission from the parallel circuit of the at least one electrical voltage source and the energy store.

6. The method of claim 3, wherein a vehicle function of the motor vehicle plans the start of the load, and the vehicle function is deactivated based on the final value being less than a predetermined minimum voltage value.

7. The method of claim 1, wherein the energy store is a lead accumulator and the predetermined maximum value is based on a maximum idle voltage plus an overvoltage of the lead accumulator.

8. A motor vehicle, comprising:
at least one electrical voltage source;
an energy store;
at least one voltage source;
a vehicle electrical system, wherein the at least one electrical voltage source and the energy store are connected in a parallel circuit to the vehicle electrical system, the at least one electrical voltage source and the energy store provide a supply current for operating a load, and wherein the energy store neither receives a charging current nor discharges generated power if a vehicle electrical system voltage of the vehicle electrical system is greater than a predetermined maximum value; and
a control unit that predicts a voltage drop before a planned start of the load, wherein the con trot unit is configured to:
ascertain a value of the supply current expected to be required after the start of the load; and
based on an instantaneous value of the vehicle electrical system voltage, ascertain a proportion of the supply current that the at least one electrical voltage source generates as a source current without the energy store until the vehicle electrical system voltage has fallen to the predetermined maximum value.

9. The motor vehicle of claim 8, wherein the energy store is a lead accumulator.

10. The motor vehicle of claim 8, wherein the at least one electrical voltage source comprises a lithium-ion battery, a generator, or a DC voltage converter.

11. The motor vehicle of claim 8, wherein the control unit is further configured to:
ascertain the source current based on a respective internal resistance of the at least one electrical voltage source.

12. The motor vehicle of claim 11, herein the control unit is further configured to:
ascertain a residual current between the ascertained supply current and the ascertained source current; and
ascertain, based on the predetermined maximum value, a final value of the vehicle electrical system voltage that results upon a current emission from the parallel circuit of the at least one electrical voltage source and the energy store.

13. The motor vehicle of claim 12, wherein the control unit is further configured to:
ascertain the final value based on the respective internal resistance of the at least one electrical voltage source and an internal resistance of the energy store.

14. The motor vehicle of claim 13, wherein the control unit is further configured to:
based on the instantaneous value of the vehicle electrical system voltage being less than the based on the instantaneous value of the vehicle electrical system voltage being less than the predetermined maximum value, ascertaining the final value based exclusively on the current emission from the parallel circuit of the at least one electrical voltage source and the energy store.

15. The motor vehicle of claim 12, wherein a vehicle function of the motor vehicle plans the start of the load, and the vehicle function is deactivated based on the final value being less than a predetermined minimum voltage value.

16. The motor vehicle of claim 9, wherein the predetermined maximum value is based on a maximum idle voltage plus an overvoltage of the lead accumulator.

\* \* \* \* \*

UNITED STATES PATENT AND TRADEMARK OFFICE
CERTIFICATE OF CORRECTION

PATENT NO. : 10,670,640 B2  
APPLICATION NO. : 15/762718  
DATED : June 2, 2020  
INVENTOR(S) : Renner et al.

Page 1 of 1

It is certified that error appears in the above-identified patent and that said Letters Patent is hereby corrected as shown below:

At Column 9, Line 61, please replace "thy:" with -- the --.

At Column 10, Line 22, please replace "con trot" with -- control --.

At Column 10, Line 41, please replace "herein" with -- wherein --.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*